United States Patent [19]

Roitman et al.

[11] Patent Number: 6,043,166
[45] Date of Patent: Mar. 28, 2000

[54] SILICON-ON-INSULATOR SUBSTRATES USING LOW DOSE IMPLANTATION

[75] Inventors: Peter Roitman, Gaithersburg, Md.; Devendra Kumar Sadana, Pleasantville, N.Y.

[73] Assignees: International Business Machines Corporation, Armonk, N.Y.; The United States of America as represented by the Department of Commerce, Washington, D.C.

[21] Appl. No.: 08/961,131

[22] Filed: Oct. 30, 1997

Related U.S. Application Data

[60] Provisional application No. 60/032,331, Dec. 3, 1996.

[51] Int. Cl.⁷ .................................................. H01L 21/265
[52] U.S. Cl. .......................... 438/766; 438/480; 438/528
[58] Field of Search .................................. 438/480, 528, 438/527, 529, 530, 918, 766, FOR 158, FOR 407; 148/DIG. 76, DIG. 83; 257/347, 506

[56] References Cited

U.S. PATENT DOCUMENTS

| | | | |
|---|---|---|---|
| 4,676,841 | 6/1987 | Celler | 438/766 |
| 4,749,660 | 6/1988 | Short et al. | 438/766 |
| 4,786,608 | 11/1988 | Griffith | 438/766 |
| 4,975,126 | 12/1990 | Margail et al. | 438/766 |
| 5,143,858 | 9/1992 | Tomozane et al. | 438/480 |
| 5,196,355 | 3/1993 | Wittkower | 438/766 |
| 5,238,858 | 8/1993 | Matsushta | 438/529 |
| 5,288,650 | 2/1994 | Sandow | 438/766 |
| 5,422,305 | 6/1995 | Seabaugh et al. | 438/766 |
| 5,436,175 | 7/1995 | Nakato et al. | 438/766 |
| 5,534,446 | 7/1996 | Tachimori et al. | 438/766 |
| 5,661,043 | 8/1997 | Rissman et al. | 438/766 |
| 5,661,044 | 8/1997 | Holland et al. | 438/766 |

FOREIGN PATENT DOCUMENTS

| | | |
|---|---|---|
| 3-240230 | 10/1991 | Japan . |
| 4-249 323 | 9/1992 | Japan . |
| 4-264724 | 9/1992 | Japan . |
| 5-337894 | 12/1993 | Japan . |

OTHER PUBLICATIONS

Robinson et al., "Low Energy Low Dose Optimization for Thin Film. Separation by Implanted Energy." Material Science and Engineering B12 (1992) pp. 41–45.

Nakashima et al, "Analysis of Buried Oxide Layer Formation and Mechanism Threading Dislocation." Journal Meterial Res, vol. 8 1993, pp. 523–534.

Li et al., "Analysis of Thin Film Silicon on Insulator Structures Formed by Low Energy Oxygen Implantation" J. Appl. Phys. vol. 70, 1991, pp. 3605–3612.

Hemment et al., "Nucliation and Growth of SiO2 Pecipitates in SOI/SIMOX Related Materials—Dependence on Damage and Atomic Oxygen Profiles" Nuclear Instruments and Methods in Physics Research B39 (1989) 210–216.

*Primary Examiner*—Savitri Mulpuri
*Attorney, Agent, or Firm*—Robert M. Trepp

[57] ABSTRACT

An SOI substrate and method of forming is described incorporating the steps of implanting oxygen under two conditions and performing two high temperature anneals at temperatures above 1250° C. and above 1300° C., respectively, at two respective oxygen concentrations. The invention overcomes the problem of high SOI substrate fabrication cost due to ion implant time and of getting high quality buried oxide (BOX) layers below a thin layer of single crystal silicon.

9 Claims, 2 Drawing Sheets

SILICON-ON-INSULATOR SUBSTRATES USING LOW DOSE IMPLANTATION

The present application claims priority to provisional application Ser. No. 60/032,331 filed Dec. 3, 1996.

GOVERNMENT CONTRACT

The Government has rights in this invention pursuant to Contract No. N66001-95-C-6009 with the Dept. of Defense.

GOVERNMENT OWNERSHIP

The Government has an ownership interest in the invention in-as-much as one of the inventors herein is an employee of the Dept. of Commerce, National Institute of Standards and Technology (NIST).

FIELD OF THE INVENTION

This invention relates to semiconductor substrates or wafers and more particularly, to silicon-on-insulator substrates using separation by implantation of oxygen (SIMOX) to provide a layer of single crystal silicon on a silicon dioxide layer over a substrate of silicon.

BACKGROUND OF THE INVENTION

Silicon-On-Insulator (SOI) substrates may be fabricated by a process known as separation by implantation of oxygen (SIMOX). A large part of the cost to fabricate SOI substrates is the time required to implant oxygen by an ion implanter. Quality, thickness and uniformity of the top silicon layer, quality, thickness and uniformity of the buried oxide layer, silicon defect thickness above the buried oxide layer are variables in the SOI substrates resulting from the particular SIMOX fabrication process used.

There is an increasing interest in low-dose (LD) SIMOX to reduce the time of implantation and thus the cost of SOI substrates. The lower dose results in less machine time required to implant the oxygen. Furthermore, the structural and electrical quality of the Si active layer improves in the LD SIMOX material. The standard procedures used for LD SIMOX typically have the following deficiencies: (1) a buried oxide (BOX) breakdown voltage $V_{bd}$ of less than 8 Mv/cm, (2) electrical shorts such as 5 to 10 shorts $cm^{-2}$, (3) Si islands within the BOX of $10^3$ to $10^4$ islands $cm^{-2}$, and (4) a rough Si surface.

SUMMARY OF THE INVENTION

In accordance with the present invention, an SOI substrate and method for forming SOI substrates is described comprising the steps of heating a major surface of a silicon substrate in the range from about 515° C. to about 635° C. and preferably about 590° C., first implanting ions of $O^+$ at an energy in the range from about 70 keV to about 200 keV and preferably about 170 keV into the major surface of the silicon substrate with a dose in the range from about $1.0 \times 10^{17}$ $cm^{-2}$ to about $3.5 \times 10^{17}$ $cm^{-2}$ and preferably about $3 \times 10^{17}$ $cm^{-2}$, cooling the major surface of the silicon substrate below 300° C. such as about 23° C., second implanting ions of $O^+$ at an energy in the range from about 70 keV to about 200 keV and preferably about 170 keV into the major surface of the silicon substrate with a dose in the range from about $7 \times 10^{14}$ $cm^{-2}$ to about $2 \times 10^{15}$ $cm^{-2}$ and preferably about $9 \times 10^{14}$ $cm^{-2}$, first annealing the major surface of the silicon substrate at a temperature in the range from about 1250° C. to about 1400° C. and preferably about 1320° C. for about 6 hrs in an ambient containing $O_2$ such as 0.2 to 2% $O_2$, stripping the surface oxide and second annealing the major surface of the silicon substrate at a temperature in the range from about 1300° C. to about 1400° C. for about 1 to 4 hrs. and preferably about 1350° C. for about 2 hrs 40 min in an ambient containing $O_2$ such as 50% $O_2$.

The invention provides a high quality buried oxide layer with extremely low doses of oxygen.

The invention further provides a two step implantation of oxygen in silicon at two substrate temperatures and two respective doses followed by a two step annealing procedure at high temperatures at two respective oxygen ambients.

The invention further provides a two step high temperature oxidation anneal to eliminate defects in the silicon above the buried oxide by forming silicon dioxide as part of the buried oxide in the region where the defects were present.

The invention further provides a buried oxide layer of uniform thickness with a smooth continuous buried oxide upper surface.

The invention further provides a buried oxide layer with a breakdown voltage greater than 8 MV/cm and with shorts less than 1 short/$cm^2$.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENT

Figure 1:
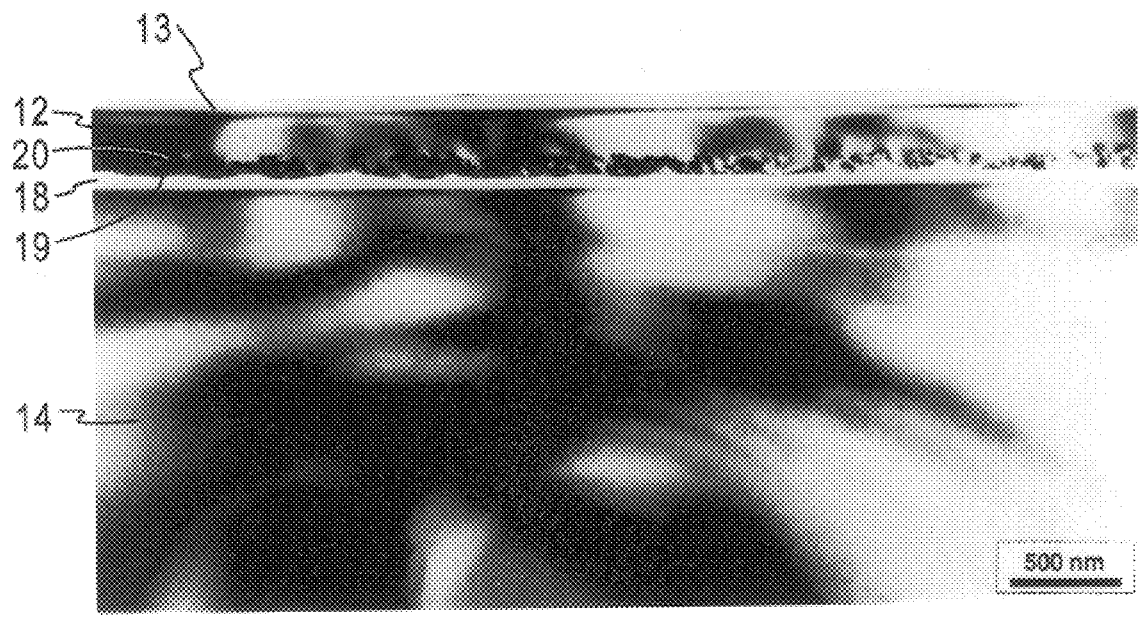
FIG. 1 is a cross-section view via a TEM micrograph of one embodiment of the invention after the steps of ion implantation.
Figure 2:
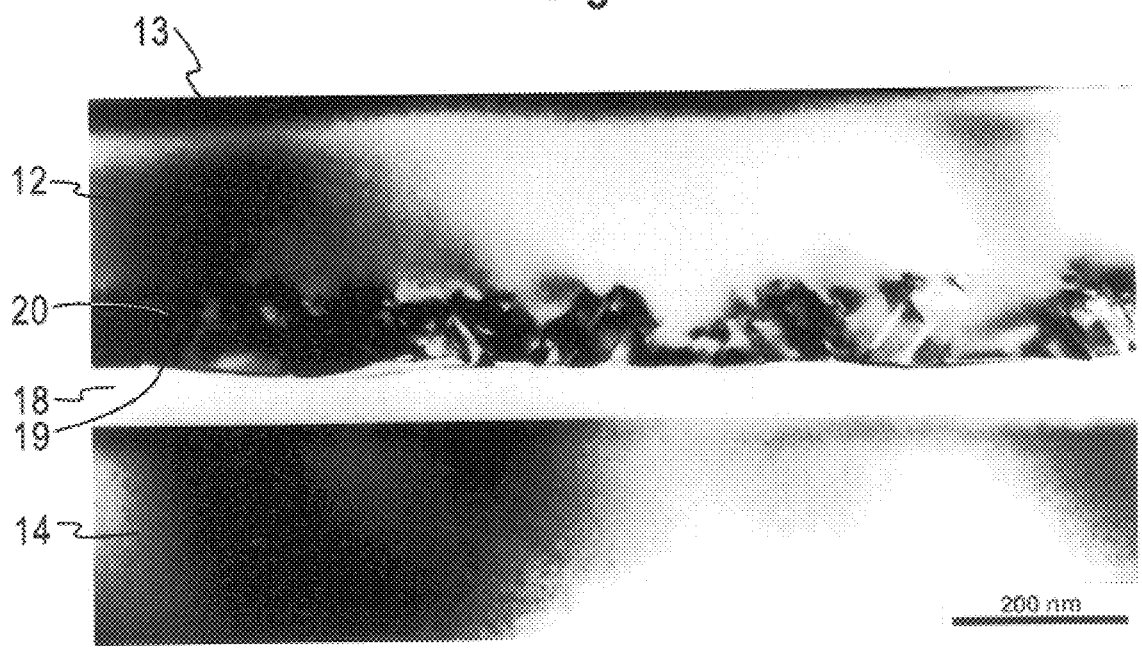
FIG. 2 is an enlarged view of a portion of the same sample shown in FIG. 1.

Referring now to the drawing and in particular to FIGS. 1 and 2, a silicon layer 12 is shown separated from substrate 14 by buried oxide (BOX) layer 18. FIG. 1 is a cross section view at a first magnification and FIG. 2 is an enlarged view of a portion of the same sample shown in FIG. 1. The material on top of surface 13 in FIG. 1 is a layer of glue to prepare the TEM sample for examination. Substrate 14 may be silicon or silicon germanium alloy. Buried oxide layer 18 may be formed by implanting oxygen through upper surface 13 of layer 12 and by annealing. The lower portion 20 of layer 12 has a thickness in the range from 300 to 800 Å from the interface of buried oxide layer 18 up into silicon layer 12. Further, the thickness of oxide layer 18 may be in the range of 300 to 800 Å and the thickness of Si layer 12 may be 100 to 2300 Å. Portion 20 is a silicon crystalline defect region having stacking faults and dislocation defects. As shown in FIGS. 1 and 2, the upper surface 19 of buried oxide layer 18 is wavy having a variation of about 300 to 500 Å while the bottom surface is substantially flat.

Figure 3:
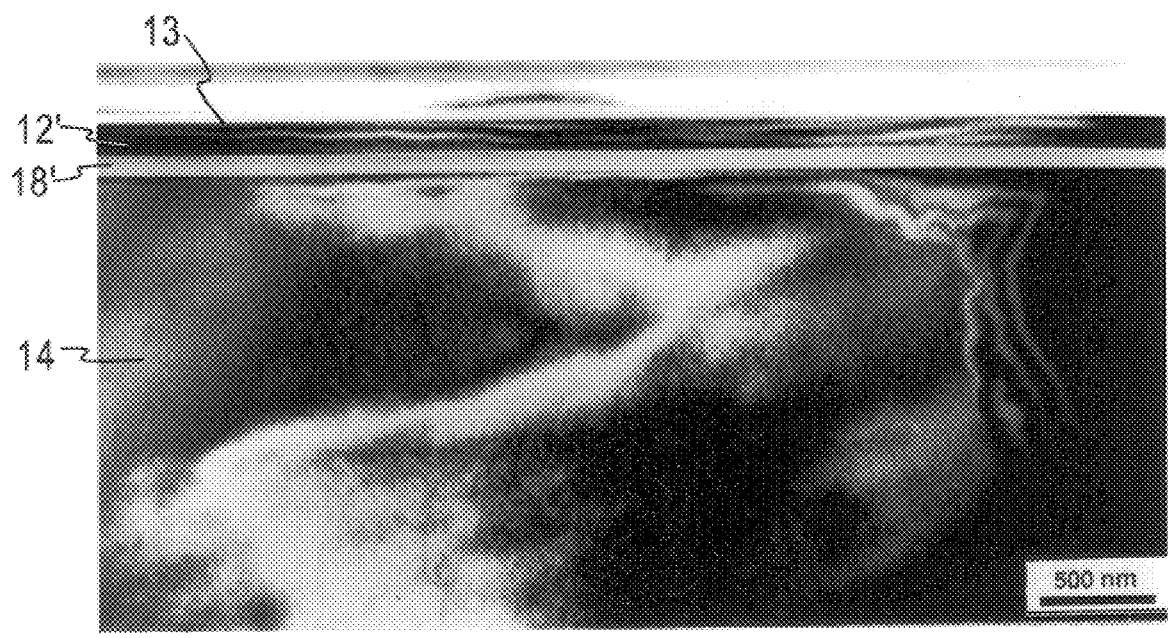
FIG. 3 is a cross-section view via a TEM micrograph of a second embodiment of the invention after the steps of high temperature anneal.
Figure 4:
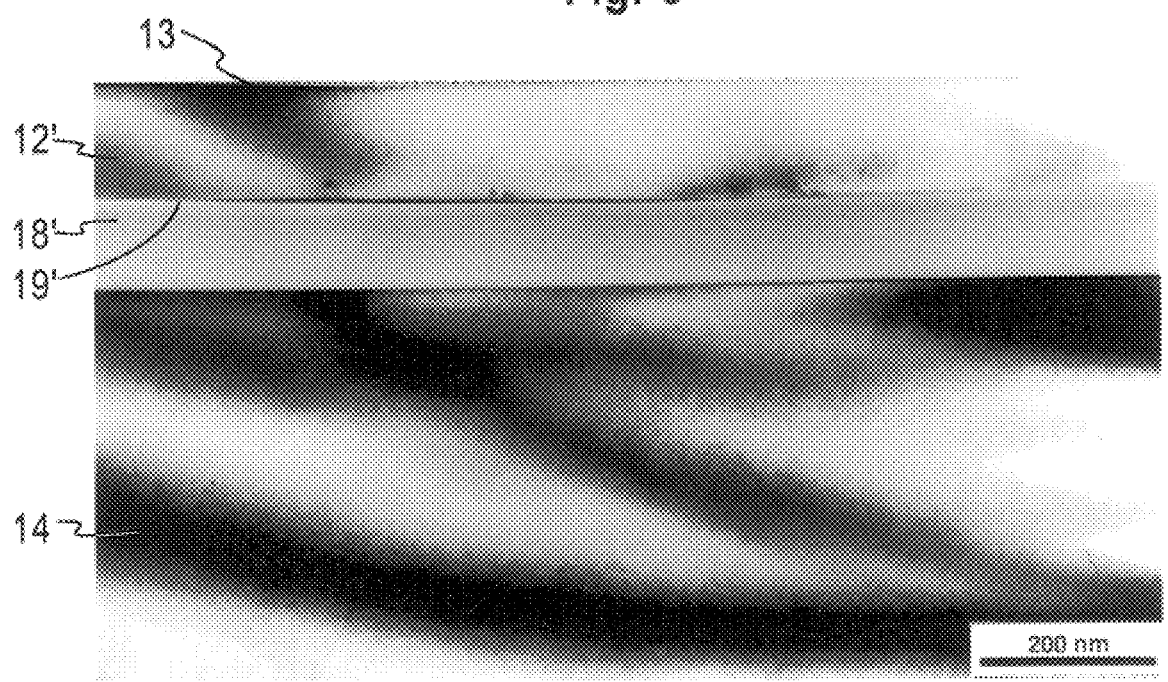
FIG. 4 is an enlarged view of a portion of the same sample shown in FIG. 3.

FIG. 3 is a cross section view via a TEM micrograph of the embodiment of FIG. 1 after the steps of annealing as described below. FIG. 4 is an enlarged view of a portion of the same sample shown in FIG. 3. In FIGS. 3 and 4, like references are used for functions corresponding to the apparatus of FIGS. 1 and 2. In FIG. 3, the material on top of surface 13 is a layer of glue as in FIG. 1 and a portion of another TEM sample glued to surface 13 of the TEM sample shown. In FIGS. 3 and 4, buried oxide layer 18' has a uniform thickness which is thicker than layer 18 and a substantially flat upper surface 19'. The steps of annealing to be described below enlarged the thickness of buried oxide layer 18' to include or consume a portion 20 of layer 18 thus removing portion 20 which had many crystal defects.

Referring to FIGS. 1 and 2, buried oxide layer 18 is formed by first heating substrate 14 or its major surface in the range from 515° C. to about 635° C. and preferably 590° C., then implanting through the major surface into substrate 14 oxygen ions at an energy in the range from about 70 keV to about 200 keV with a dose in the range from about $1.0 \times 10^{17}$ cm$^{-2}$ to about $4.5 \times 10^{17}$ cm$^{-2}$ to form a silicon dioxide layer in the range from about less than 500 Å to about greater than 1000 Å thick, such as 1100 Å. Silicon layer 12 may be about 1500 Å to about 3000 Å thick.

Table I shows various energy values and corresponding dose rates for forming buried oxide layer 18, although doses somewhat higher or lower than these ranges can also be used in accordance with this invention to form continuous buried oxide. The implantation of oxygen amorphizes crystal silicon substrate 14 at the depth of ion penetration which is distributed in depth which corresponds to the subsequent location of buried oxide layer 18.

TABLE I

| energy KeV | Dose range ($\times 10^{17}$ions cm$^{-2}$) | preferred dose ($\times 10^{17}$ions cm$^{-2}$) |
|---|---|---|
| 120 | 1.0 to 3.5 | 2.0 |
| 170 | 1.0 to 4.0 | 3.0 |
| 200 | 1.0 ta 4.5 | 3.5 |

The major surface of silicon substrate 14 or of silicon layer 12 is cooled to a temperature below, for example, 300° C. The temperature may be room temperature such as 23° C. or even cooler such as cryogenic temperatures i.e. 77° K. or 4° K., or such other temperature which acts to maintain the region surrounding interface or surface 19 in an amorphous condition after the second implant but before the first anneal.

Next, oxygen ions are implanted at an energy in the range from about 70 keV to about 200 keV into the major surface of substrate 14 with a low dose in the range from about $1.0 \times 10^{14}$ cm$^{-2}$ to about $2.0 \times 10^{15}$ cm$^{-2}$. This low dose at a temperature below 300° C., amorphizes silicon to provide a continuous high quality BOX 18' after high temperature anneal. Without this low dose at a temperature below 300° C., a discontinuous BOX is typically created after high temperature anneal. The discontinuous BOX is in the form of broken $SiO_2$ islands centered around the projected range or depth of oxygen in silicon. No continuous BOX can be created by performing high temperature Oxidation (HTO) on such a structure. With no continuous BOX, the separated layer 12 is almost totally shorted to substrate 14.

Annealing of substrate 14 with the implanted oxygen may be performed in two steps. First, the major surface of silicon substrate 14 is annealed at a first temperature in the range from about 1250° C. to about 1400° C. for about in the range from about 4 hrs to about 8 hrs and preferably 6 hrs in a first ambient containing $O_2$ at a first concentration such as in the range from about 0.2 to about 2 atomic percent. The anneal step should be for at least 3 hrs. The oxygen in the ambient is necessary to oxidize the upper surface of layer 12 to prevent evaporation of silicon or the formation of silicon monoxide from the upper surface which has the effect of roughening the upper surface. Other gases in the first ambient may be inert gases such as Ar, $N_2$ or both.

For best performance, the removal of the surface oxide coated during the first anneal is preferred to enhance oxygen diffusion to Box 18'.

A second step of annealing of the major surface of silicon substrate 14 is carried out at a second temperature in the range from about 1300° C. to about 1400° C. in the range from about 1 hr. to about 4 hrs. and preferably for about 2 hrs 40 min in a second ambient containing $O_2$ at a second concentration in the range from about 10 to about 100 atomic percent. The anneal step should be for at least 1 hr 20 min. Other gases in the second ambient may be inert gases, such as, Ar, $N_2$ or both. The second step of annealing in a higher oxygen concentration is to allow the oxygen to diffuse through the top oxide layer, through the silicon layer 12 to buried oxide layer surface 19' wherein the lower portion 20 of silicon layer 12 is oxidized causing BOX 18' to grow thicker and surface 19' to move upwards. Buried layer 18' thus grows thicker with anneal time and the defect portion 20 is consumed or turned into silicon dioxide layer 18'. At the same time the silicon dioxide layer on the upper surface of silicon layer 12 grows thicker into and consuming the upper portion of layer 12. Thus, the thickness of silicon layer 12 is thinned during the second anneal as a function of temperature, oxygen concentration and time. The energy of the oxygen implant is thus adjusted to place the oxygen at an appropriate depth for forming the BOX layer 18' and to leave a desired thickness of silicon layer 12'.

The BOX layer 18' has a breakdown voltage $V_{bd}$ greater than 8 MV/cm and has less than 1 short/cm$^2$ from its upper surface to its lower surface.

While there has been described and illustrated a buried oxide layer below a layer of single crystal silicon and a process for making consisting of two steps of ion implantation and two steps of high temperature anneal in respective oxygen ambients, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method for forming a single crystal layer of silicon on an insulating layer comprising the steps successively of:

heating a major surface of a silicon substrate in the range from about 515° C. to about 635° C., first implanting ions of O$^+$ at an energy in the range from about 70 keV to about 200 keV into said major surface of said silicon substrate with a dose in the range from about $1.0 \times 10^{17}$ cm$^{-2}$ to about $3.5 \times 10^{17}$ cm$^{-2}$, cooling said major surface of said silicon substrate below 300° C., second implanting ions of O$^+$ at an energy in the range from about 70 keV to about 200 keV into said major surface of said silicon substrate with a dose in the range from about $1.0 \times 11^{14}$ cm$^{-2}$ to about $2.0 \times 0^{15}$ cm$^{-2}$, first annealing said major surface of said silicon substrate at a first temperature in the range from about 1250° C. to about 1400° C. in a first ambient containing $O_2$ at a first concentration, and second annealing said major surface of said silicon substrate at a second temperature in the range from about 1300° C. to about 1400° C. in a second ambient containing $O_2$ at a second concentration.

2. The method of claim 1 wherein said first concentration of $O_2$ is in the range from about 0.2 to about 2 atomic percent.

3. The method of claim 2 wherein said first ambient is selected from the group consisting of Ar and $N_2$.

4. The method of claim 1 wherein said second concentration of $O_2$ is in the range from about 10 to about 100 atomic percent.

5. The method of claim 4 wherein said second ambient is selected from the group consisting of Ar and $N_2$.

6. The method of claim 1 wherein said step of first annealing includes annealing at said first temperature for at least 3 hrs.

7. The method of claim 1 wherein said step of first annealing includes annealing at said first temperature in the range from about 4 to about 8 hrs.

8. The method of claim 1 wherein said step of second annealing includes annealing at said second temperature for at least 1 hr.

9. The method of claim 1 wherein said step of second annealing includes annealing at said second temperature in the range from about 1 hr. to about 4 hrs.

* * * * *